United States Patent
Honda

(10) Patent No.: US 8,671,882 B2
(45) Date of Patent: Mar. 18, 2014

(54) PLASMA PROCESSING APPARATUS

(75) Inventor: Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1501 days.

(21) Appl. No.: 12/053,933

(22) Filed: Mar. 24, 2008

(65) Prior Publication Data

US 2008/0236752 A1    Oct. 2, 2008

Related U.S. Application Data

(60) Provisional application No. 60/938,737, filed on May 18, 2007.

(30) Foreign Application Priority Data

Mar. 29, 2007  (JP) ................................. 2007-089804

(51) Int. Cl.
C23C 16/50 (2006.01)
C23C 16/00 (2006.01)
C23F 1/00 (2006.01)
H01L 21/306 (2006.01)

(52) U.S. Cl.
USPC ................. 118/723 R; 118/715; 118/723 E; 118/728; 156/345.43; 156/345.44; 156/345.47; 156/345.51

(58) Field of Classification Search
USPC ......................................... 118/715, 728–732
See application file for complete search history.

(56) References Cited

U.S. PATENT DOCUMENTS

2003/0134515 A1* 7/2003 David et al. ................. 438/694
2006/0037703 A1* 2/2006 Koshiishi et al. ........ 156/345.47

FOREIGN PATENT DOCUMENTS

JP          9-199476       7/1997
JP          2006-81352     3/2006
JP          2006-270018    10/2006

* cited by examiner

*Primary Examiner* — Maureen Gramaglia
*Assistant Examiner* — Tiffany Nuckols
(74) *Attorney, Agent, or Firm* — Oblon, Spivak, McClelland, Maier & Neustadt, L.L.P.

(57) ABSTRACT

A plasma processing apparatus capable of, over a prolonged period of time, controlling a decrease in the value of a DC current flowing within an accommodating compartment. The plasma processing apparatus comprises an accommodating compartment adapted to accommodate a substrate and perform a plasma treatment thereon, a high-frequency power source adapted to supply high-frequency power to the inside of the accommodating compartment; a DC electrode adapted to apply a DC voltage to the inside of the accommodating compartment, a ground electrode provided within the accommodating compartment and used for the applied DC voltage, and an exhaust unit adapted to evacuate the inside of the accommodating compartment.

20 Claims, 7 Drawing Sheets

PLASMA PROCESSING APPARATUS

BACKGROUND OF THE INVENTION

1. Field of the Invention

The present invention relates to a plasma processing apparatus and, more particularly, to a plasma processing apparatus having an electrode connected to a DC power source.

2. Description of the Related Art

There is known a parallel plate type plasma processing apparatus provided with an accommodating compartment for accommodating a wafer serving as a substrate, a lower electrode disposed within the accommodating compartment and connected to a high-frequency power source, and an upper electrode disposed so as to face the lower electrode. In this plasma processing apparatus, a processing gas is introduced into the accommodating compartment and high-frequency power is supplied into the accommodating compartment. In addition, plasma is produced from the introduced processing gas by the high-frequency power when the wafer is accommodated into the accommodating compartment and mounted on the lower electrode. Thus, a plasma treatment, such as an etching treatment, is performed on the wafer using the plasma, etc.

In recent years, there has been developed a plasma processing apparatus wherein an upper electrode is connected to a DC power source and a DC voltage is applied to the inside of the accommodating compartment, in order to improve the performance of plasma treatments. In order to apply a DC voltage to the inside of the accommodating compartment, there is the need to provide a ground electrode used for the DC voltage applied to the inside of the accommodating compartment within which a surface of the ground electrode is exposed (hereinafter simply referred to as the "ground electrode"). However, when performing a plasma treatment using a reactive processing gas, a reaction product (deposition) may adhere to a surface of the ground electrode and, therefore, a deposition film may be formed.

Since the deposition film is insulative, the flow of a DC current from the upper electrode to the ground electrode is blocked, thereby disabling the application of a DC voltage to the inside of the accommodating compartment. As a result, plasma within the accommodating compartment may fall into an unstable state or plasma treatment characteristics may change.

In consideration of the above, the present inventor has gained the knowledge, through experiments, that a main contributor to the formation of a deposition film is positive ions in plasma and that there is only a small quantity of positive ions in the vicinity of corners formed by component parts of a plasma processing apparatus. Based on the knowledge, the present inventor has proposed preventing a deposition film or the like from being formed on a surface of the ground electrode by disposing a ground electrode in the vicinity of the corners (for example, see Japanese Patent Application No. 2006-081352).

However, since the ground electrode remains exposed within the accommodating compartment even if disposed in the vicinity of the corners, some positive ions reach the ground electrode and form a deposition film on a surface thereof. The deposition film is formed slowly and, therefore, DC voltage application to the inside of the accommodating compartment is not immediately disabled. However, it has been confirmed by the present inventor that if the total time of a plasma treatment exceeds, for example, 70 hours, the value of a DC current flowing within the accommodating compartment decreases to 1.43 A to 1.33 A. Thus, there is the problem that a decrease in the value of a DC current causes a change in plasma treatment characteristics.

SUMMARY OF THE INVENTION

The present invention provides a plasma processing apparatus which is capable of, over a prolonged period of time, controlling a decrease in the value of a DC current flowing within an accommodating compartment.

In a first aspect of the present invention, there is provided a plasma processing apparatus comprising: an accommodating compartment adapted to accommodate a substrate and perform a plasma treatment thereon; a high-frequency power source adapted to supply high-frequency power to the inside of the accommodating compartment; a DC electrode adapted to apply a DC voltage to the inside of the accommodating compartment; a ground electrode provided within the accommodating compartment and used for the applied DC voltage; and an exhaust unit adapted to evacuate the inside of the accommodating compartment, wherein the plasma processing apparatus further comprises a shielding member disposed in the accommodating compartment so as to extend along the flow of exhaust gas, interpose between the flow of exhaust gas and the ground electrode, and form a cross-sectionally elongated groove-shaped space between the shielding member and the ground electrode.

According to the first aspect of the present invention, it is possible to shield the ground electrode from positive ions moving from plasma distributed within the accommodating compartment along the flow of exhaust gas toward component parts including the ground electrode. In addition, since radicals in the plasma easily adhere to members, the radicals adhere to both wall surfaces near the opening of the cross-sectionally long groove-shaped space and hardly enter the groove-shaped space. Consequently, the positive ions and radicals do not reach the ground electrode in the groove-shaped space. As a result, any deposition films attributable to the positive ions and radicals are not formed on the ground electrode over a prolonged period of time. On the other hand, electrons in the plasma move freely and, therefore, enter the groove-shaped space and reach the ground electrode. Hence, it is possible, over a prolonged period of time, to keep electrons reachable to the ground electrode. Thus, it is possible, over a prolonged period of time, to control a decrease in the value of a DC current flowing within the accommodating compartment.

A gap between the ground electrode and the shielding member forming the groove-shaped space can be greater than 0.5 mm.

According to the first aspect of the present invention, the opening of the groove-shaped space can be faced with the plasma. This is because the thickness of a sheath present between the plasma and component parts is, in general, approximately 0.5 mm. Consequently, it is possible to let electrons move from the plasma through the opening to the ground electrode. Thus, it is possible to reliably flow a DC current into the accommodating compartment.

The gap can be not less than 2.5 mm but not greater than 5.0 mm.

According to the first aspect of the present invention, electrons are not blocked from entering the groove-shaped space, whereas radicals are prevented from entering thereinto. Consequently, it is possible, over a prolonged period of time, to reliably control a decrease in the value of a DC current flowing within the accommodating compartment.

The gap can be not less than 3.5 mm.

According to the first aspect of the present invention, a gap between the ground electrode and the shielding member forming the groove-shaped space is 3.5 mm or greater. The opening of the groove-shaped space therefore widens, thereby allowing electrons to smoothly enter the groove-shaped space and enabling the prevention of the occurrence of plasma fluctuations.

An aspect ratio in a cross section of the groove-shaped space can be not less than 3.0.

According to the first aspect of the present invention, radicals adhere to both wall surfaces near the opening of the cross-sectionally long groove-shaped space before entering deep thereinto. As a result, the radicals do not enter deep into the groove-shaped space. Thus, it is possible, over a prolonged period of time, to prevent the entire surface of the ground electrode from being covered with a deposition film.

The edge of the shielding member on the opening side of the groove-shaped space can protrude along the flow of exhaust gas from the edge of the ground electrode on the opening side.

According to the first aspect of the present invention, radicals trying to enter the groove-shaped space through the opening thereof can be made to actively adhere to the shielding member. As a result, it is possible, over a prolonged period of time, to prevent the entire surface of the ground electrode from being covered with a deposition film.

The amount of protrusion of the edge of the shielding member on the opening side from the edge of the ground electrode on the opening side can be not greater than 3 mm.

According to the first aspect of the present invention, the protruding part of the shielding member can inhibit the blockage of electrons from entering the groove-shaped space. Thus, it is possible to prevent the occurrence of plasma fluctuations.

In a second aspect of the present invention, there is provided a plasma processing apparatus comprising: an accommodating compartment adapted to accommodate a substrate and perform a plasma treatment thereon; a high-frequency power source adapted to supply high-frequency power to the inside of the accommodating compartment; a DC electrode adapted to apply a DC voltage to the inside of the accommodating compartment; a ground electrode exposed to the surfaces of component parts within the accommodating compartment and used for the applied DC voltage provided; and an exhaust unit adapted to evacuate the inside of the accommodating compartment, wherein the plasma processing apparatus further comprises a shielding member disposed in the accommodating compartment so as to extend along the surfaces of the component parts and form a cross-sectionally elongated groove-shaped space between the shielding member and the ground electrode.

According to the second aspect of the present invention, plasma is distributed along surfaces of component parts within the accommodating compartment and positive ions move from the plasma to the component parts including the ground electrode. Since the shielding member is disposed so as to locate along the surfaces of the component parts, the shielding member shields the ground electrode from moving positive ions. In addition, since radicals in the plasma easily adhere to members, the radicals adhere to both wall surfaces near the opening of the cross-sectionally long groove-shaped space and hardly enter the groove-shaped space. Consequently, the positive ions and radicals do not reach the ground electrode in the groove-shaped space. As a result, any deposition films attributable to the positive ions and radicals are not formed on the ground electrode over a prolonged period of time. On the other hand, electrons in the plasma move freely and, therefore, enter the groove-shaped space and reach the ground electrode. Hence, it is possible, over a prolonged period of time, to keep electrons reachable to the ground electrode. Accordingly, it is possible, over a prolonged period of time, to control a decrease in the value of a DC current flowing within the accommodating compartment.

The above and other objects, features, and advantages of the invention will become more apparent from the following detailed description taken in conjunction with the accompanying drawings.

DETAILED DESCRIPTION OF THE PREFERRED EMBODIMENTS

Preferred embodiments of the present invention will be now described in detail with reference to the drawings.

Figure 1:
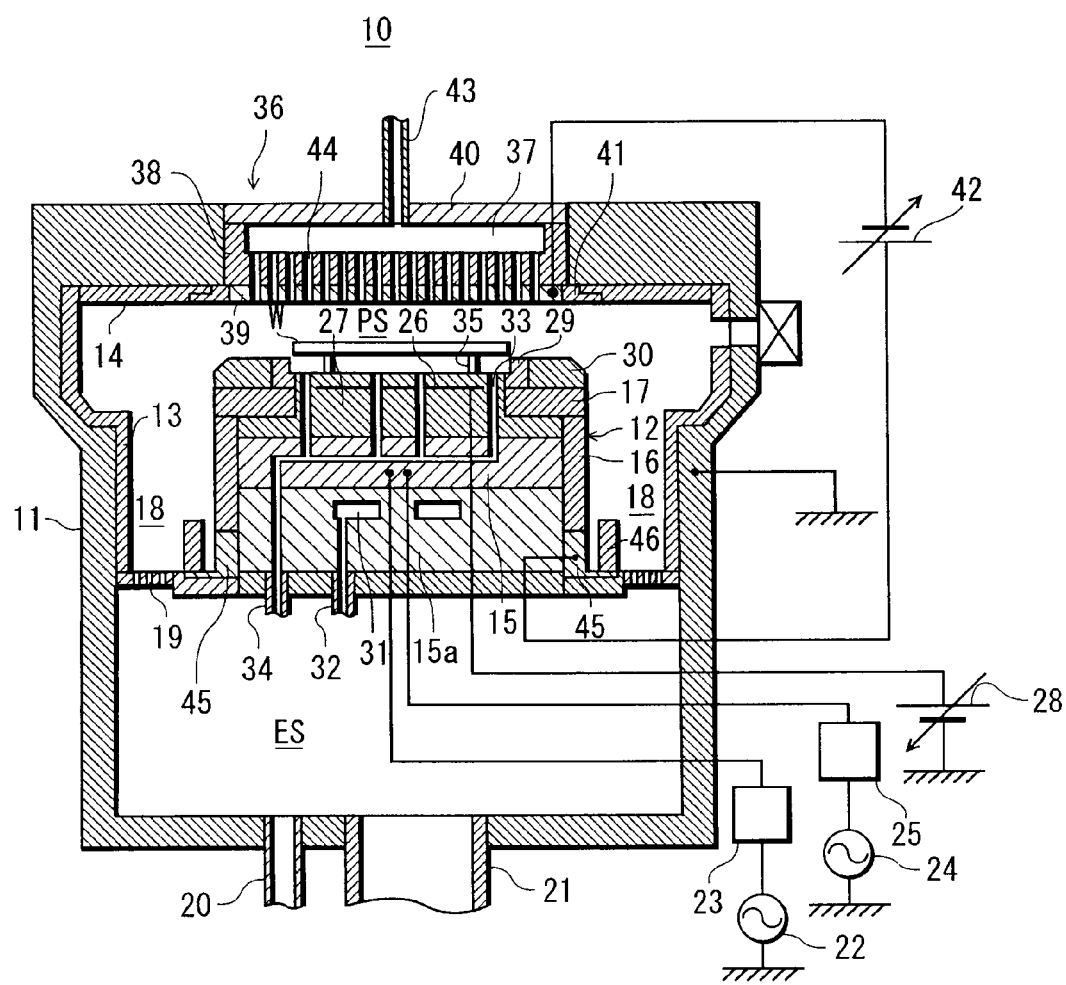
FIG. 1 is a cross-sectional view illustrating a schematic configuration of a plasma processing apparatus in accordance with an embodiment of the present invention.

FIG. 1 is a cross-sectional view illustrating a schematic configuration of a plasma processing apparatus in accordance with an embodiment of the present invention. This plasma processing apparatus is configured to perform an etching treatment on a semiconductor wafer W serving as a substrate.

In FIG. 1, a plasma processing apparatus 10 includes an approximately cylindrical accommodating compartment 11 for accommodating a semiconductor wafer W (hereinafter simply referred to as the "wafer W") and the accommodating compartment 11 includes a processing space PS (within the accommodating compartment) formed upwardly therein. In the processing space PS, there is produced plasma to be explained later. In addition, a cylindrical susceptor 12 serving as a mounting stage to be mounted with a wafer W is disposed within the accommodating compartment 11. The inner side wall surface of the accommodating compartment 11 is covered with aside wall member 13 and the inner upper wall surface thereof is covered with an upper wall member 14. The side wall member 13 and the upper wall member 14 are made of aluminum and the surfaces thereof facing the processing space PS are coated with yttria or alumite having a predetermined thickness. Since the accommodating compartment 11 is electrically grounded, the side wall member 13 and the upper wall member 14 are at a ground potential. In addition, the susceptor 12 includes a conductor part 15 made of a conductive material, such as aluminum, a side covering member 16 (component part) made of an insulating material and used to cover the side surface of the conductor part 15, and an enclosure member 17 made of quartz (Qz) and mounted on the side covering member 16.

In the plasma processing apparatus 10, an exhaust flow passage 18 (within the accommodating compartment) functioning as a flow path for exhausting gases in the processing space PS out of the accommodating compartment 11 is formed by the inner side wall of the accommodating compartment 11 and the side wall of the susceptor 12. In this exhaust flow passage 18, there is disposed an exhaust plate 19 which is a plate-like member having a multitude of vent holes. The exhaust plate 19 divides off an exhaust space ES which is the lower space of the exhaust flow passage 18 and the accommodating compartment 11. Note here that the exhaust flow passage 18 causes the exhaust space ES and the processing space PS to be communicated with each other. In addition, a roughing exhaust pipe 20 and a main exhaust pipe 21 are open into the exhaust space ES. A dry pump (DP) (not shown) is connected to the roughing exhaust pipe 20 and a turbo molecular pump (TMP) (not shown) is connected to the main exhaust pipe 21.

The roughing exhaust pipe 20, the main exhaust pipe 21, the DP, the TMP, and the like configure an exhaust unit. The roughing exhaust pipe 20 and the main exhaust pipe 21 exhaust gases in the processing space PS out of the accommodating compartment 11 through the exhaust flow passage 18 and the exhaust space ES. Specifically, the roughing exhaust pipe 20 depressurizes the processing space PS from an atmospheric pressure to a low-vacuum state, and the main exhaust pipe 21, in conjunction with the roughing exhaust pipe 20, depressurizes the processing space PS from an atmospheric pressure to a high-vacuum state (for example, 133 Pa (1 Torr) or lower) which is lower than that of the low-vacuum state.

A high-frequency power source 22 is connected to the conductor part 15 of the susceptor 12 through a matching box 23. The high-frequency power source 22 supplies high-frequency power having a relatively high frequency, such as 40 MHz, to the conductor part 15. Consequently, the susceptor 12 functions as a high-frequency electrode and supplies 40 MHz high-frequency power to the processing space PS. Note that the matching box 23 reduces the reflection of the high-frequency power from the conductor part 15 and maximizes the efficiency of high-frequency power supply to the conductor part 15.

Another high-frequency power source 24 is connected to the conductor part 15 through a matching box 25. The additional high-frequency power source 24 supplies high-frequency power having a frequency, such as 2 MHz, lower than that of the high-frequency power supplied by the high-frequency power source 22, to the conductor part 15.

On the susceptor 12, there is disposed an electrostatic chuck 27 containing an electrostatic electrode plate 26. The electrostatic chuck 27 is formed of a lower disc-shaped member having a specific diameter on which there is placed an upper disc-shaped member having a diameter less than the diameter of the lower disc-shaped member. A lower DC power source 28 is electrically connected to the electrostatic electrode plate 26. When the susceptor 12 is mounted with a wafer W, the wafer W is placed on the electrostatic chuck 27.

At this time, a positive potential is generated on the back side of the wafer W when a negative DC voltage is applied to the electrostatic electrode plate 26. Consequently, there arises a potential difference between the electrostatic electrode plate 26 and the back side of the wafer W. Thus, the wafer W is sucked and held onto the upper surface of the electrostatic chuck 27 by a coulomb force or a Johnson-Rahbeck force caused by the potential difference.

In addition, an annular focus ring 29 is disposed on the susceptor 12, so as to surround the wafer W sucked and held onto the upper surface of the susceptor 12. This focus ring 29 is made of silicon (Si) or silica ($SiO_2$) and exposed to the processing space PS, in order to converge plasma in the processing space PS onto the surface of the wafer W and improve the efficiency of etching treatments. In addition, an annular cover ring 30 made of quartz and used to protect the side surface of the focus ring 29 is disposed around the focus ring 29.

Within the susceptor 12, there is provided, for example, an annular refrigerant chamber 31 extending in the circumference direction of the susceptor 12. A refrigerant with a predetermined temperature, for example, cooling water or a Galden (registered trademark) fluid is cyclically supplied from a chiller unit (not shown) to this refrigerant chamber 31 through a refrigerant pipe 32. The treatment temperature of the wafer W sucked and held onto the upper surface of the susceptor 12 is controlled by the refrigerant.

Furthermore, a plurality of heat-transmitting gas supply holes 33 are created in a part of the upper surface of the susceptor 12 onto which the wafer W is sucked and held (hereinafter referred to as the "sucking surface"). This plurality of heat-transmitting gas supply holes 33 are connected to a heat-transmitting gas supply unit (not shown) through a heat-transmitting gas supply line 34 disposed within the susceptor 12. The heat-transmitting gas supply unit supplies a helium (He) gas serving as a heat-transmitting gas to a gap between the sucking surface and the back side of the wafer W through the heat-transmitting gas supply holes 33.

In addition, a plurality of pusher pins 35 serving as lift pins capable of freely protruding from the upper surface of the susceptor 12 are disposed on the sucking surface of the susceptor 12. These pusher pins 35 freely protrude from the sucking surface. When sucking and holding the wafer W onto the sucking surface in order to perform an etching treatment on the wafer W, the pusher pins 35 are retracted into the susceptor 12. When the wafer W having been subjected to the etching treatment is transferred out of the accommodating compartment 11, the pusher pins 35 protrude from the sucking surface to uplift the wafer W.

A shower head 36 is disposed on the ceiling part of the accommodating compartment 11, so as to face the susceptor 12. The shower head 36 is provided with a disc-shaped cooling plate 38 made of an insulating material within which a buffer compartment 37 is formed, an upper electrode plate 39 suspended by the cooling plate 38, and a lid body 40 for covering the cooling plate 38. The upper electrode plate 39, the bottom surface of which is exposed to the processing space PS, is a disc-shaped member made of a conductive material, such as silicon. The peripheral part of the upper electrode plate 39 is covered with an annular shield ring 41 made of an insulating material. That is, the upper electrode plate 39 is electrically insulated by the cooling plate 38 and the shield ring 41 from the walls of the accommodating compartment 11 placed at a ground potential.

The upper electrode plate 39 is electrically connected to a DC power source 42 and a negative DC voltage is applied to upper electrode plate 39. Consequently, the upper electrode plate 39 applies a DC voltage to the processing space PS. Since a DC voltage is applied to the upper electrode plate 39, there is no need to interpose a matching box between the upper electrode plate 39 and the upper DC power source 42. Thus, it is possible to make the structure of the plasma processing apparatus 10 simpler, compared with a case wherein a high-frequency power source is connected to an upper electrode plate through a matching box as in a conventional plasma processing apparatus.

A processing gas introduction pipe 43 leading from a processing gas supply unit (not shown) is connected to the buffer compartment 37 of the cooling plate 38. In addition, the shower head 36 includes a plurality of through gas holes 44 whereby the buffer compartment 37 is communicated with the processing space PS. The shower head 36 supplies a processing gas, which is supplied from the processing gas introduction pipe 43 to the buffer compartment 37, to the processing space PS by way of the through gas holes 44.

The plasma processing apparatus 10 further includes a cross-sectionally L-shaped annular grounding ring 45 (ground electrode) disposed in the exhaust flow passage 18. The grounding ring 45 is made of a conductive material, such as silicon, and functions as a ground electrode used for a DC voltage applied by the upper electrode plate 39. In addition, the grounding ring 45 is disposed so as to cover the side surface of a susceptor base 15a below the side covering member 16 of the susceptor 12. That is, the grounding ring 45 appears as if it is exposed to a surface of the side covering member 16 when the susceptor 12 is viewed from a side thereof assuming that a shielding member 46 to be described later is not present. Electrons released from the upper electrode plate 39 reach this grounding ring 45, thereby causing a DC current to flow through the processing space PS.

In this plasma processing apparatus 10, high-density plasma is produced in the processing space PS from a processing gas supplied from the shower head 36 by supplying high-frequency power to the processing space PS. In addition, the produced plasma is maintained in a desired condition by the DC current of the plasma processing space PS to perform an etching treatment on a wafer W using the plasma.

Incidentally, radicals which are activated neutral particles, positive ions and electrons are mixed in the produced plasma. If positive ions and radicals, particularly CF-based positive ions and radicals, reach and adhere to the grounding ring 45, a deposition film may be formed on a surface of the grounding ring 45.

In general, in order to prevent the surfaces of members from being covered with a deposition film, there is used either (1) a method of removing the deposition film by sputtering using ions or (2) a method of preventing positive ions and radicals from reaching the surfaces of members. Note here that method 1 requires providing a sputtering step and, therefore, a step of wafer etching treatment becomes complicated. In addition, there is the possibility that a deposition sputtered and separated from the surfaces of members turn particles. Hence, in the present embodiment, method 2 is used to prevent a deposition film from being formed on the surface of the grounding ring 45.

Note here that positive ions, radicals and electrons in plasma have the movement characteristics described below.

Positive ions: Move from the plasma toward members facing the plasma.

Radicals: Easy to be trapped onto the surfaces of members. This tendency is remarkable in highly reactive radicals.

Electrons: Have no directionality in movement and, therefore, individual electrons move freely.

In the present embodiment, the grounding ring 45 is shielded from positive ions moving from plasma and a member for trapping radicals is provided in the vicinity of the grounding ring 45 in consideration of the movement characteristics of the above-described positive ions, radicals and electrons. Specifically, there is provided a shielding member 46 used to shield the grounding ring 45 shown in FIG. 1 and described in detail below in the exhaust flow passage 18 of the plasma processing apparatus 10.

Figure 2:
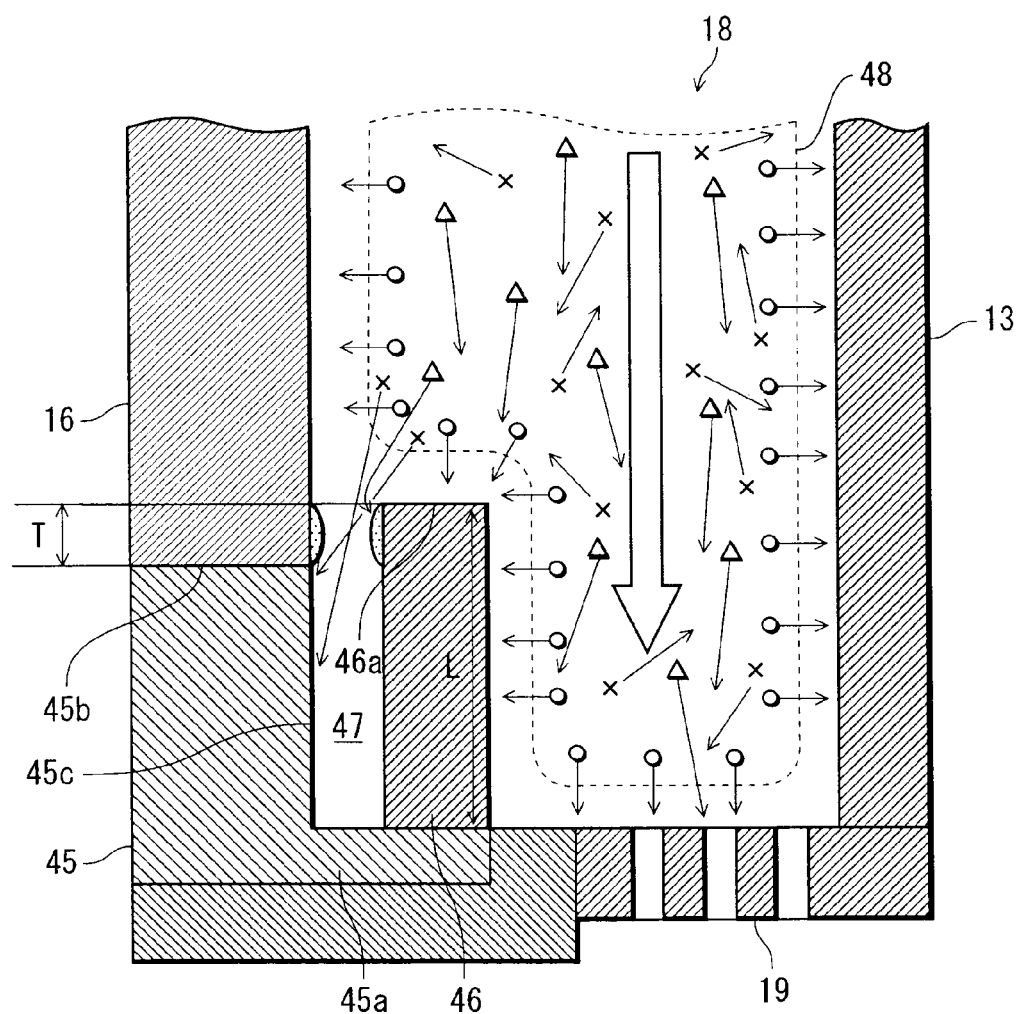
FIG. 2 is an enlarged cross-sectional view illustrating schematic configurations of a grounding ring and a shielding member for shielding the grounding ring.

FIG. 2 is an enlarged cross-sectional view illustrating schematic configurations of the grounding ring and the shielding member for shielding the grounding ring.

In FIG. 2, the annular shielding member 46 is mounted on the lower extension part 45a of the cross-sectionally L-shaped grounding ring 45. The shielding member 46 is made of an insulating material, such as quartz, and is disposed concentrically with the grounding ring 45. In addition, the shielding member 46 is disposed in a cross section along the radial direction of the grounding ring 45 (shielding member 46) (i.e., the cross section shown in FIG. 2), so as to locate along the surface of the side covering member 16, thereby forming a cross-sectionally long groove-shaped space 47 between the shielding member 46 and the grounding ring 45. Note here that since the flow of exhaust gas (shown by an outline arrow in the figure) in the exhaust flow passage 18 is directed along the surface of the side covering member 16, the shielding member 46 is also directed along the flow of exhaust gas in the above-described cross section. Since the groove-shaped space 47 is sandwiched by the grounding ring 45 exposed to the surface of the side covering member 16 and the shielding member 46 directed along the flow of exhaust gas, the groove-shaped space 47 is also directed along the flow of exhaust gas. Thus, the shielding member 46 interposes between the flow of exhaust gas and the grounding ring 45. Note that the groove-shaped space 47 is open toward the upstream of the flow of exhaust gas.

In addition, the edge 46a of the shielding member 46 on the opening side of the groove-shaped space 47 (hereinafter simply referred to as the "opening side") protrudes along the flow of exhaust gas more than the edge 45b of the grounding ring 45 on the opening side thereof. Specifically, the edge 46a protrudes toward the upstream of the flow of exhaust gas.

In the exhaust flow passage 18, plasma 48 is distributed along the flow of exhaust gas, as well as along the surfaces of component parts such as the side covering member 16. Positive ions shown by "O" in the figure move from the plasma 48 toward the side covering member 16 and the grounding ring 45. Since the shielding member 46 interposes between the flow of exhaust gas (i.e., the plasma 48) and the grounding ring 45, the shielding member 46 shields the grounding ring 45 from the moving positive ions.

In addition, radicals shown by "Δ" in the figure try to move from the plasma 48 to enter the groove-shaped space 47. Since the radicals generally move along the flow of exhaust gas, they can hardly enter the groove-shaped space 47 which is only open toward the upstream of the flow of exhaust gas. Furthermore, since the radicals are easy to be trapped onto the surfaces of members, they adhere to both wall surfaces near the opening of the groove-shaped space 47. As a result, the radicals hardly enter the groove-shaped space 47. In the plasma processing apparatus 10 in particular, the edge 46a of the shielding member 46 protrudes toward the upstream of the flow of exhaust gas more than the edge 45b of the grounding ring 45 on the opening side thereof, the radicals actively adhere to the shielding member 46.

Consequently, positive ions and radicals do not reach the ground electrode surface 45c of the grounding ring 45 in the groove-shaped space 47. As a result, any deposition films attributable to the positive ions and radicals are not formed on the ground electrode surface 45c over a prolonged period of time.

On the other hand, since electrons shown by "X" in the figure move freely, they move from the plasma 48 to enter the groove-shaped space 47 and reach the ground electrode surface 45c. Accordingly, it is possible to flow a DC current through the processing space PS and the exhaust flow passage 18.

Figure 3:
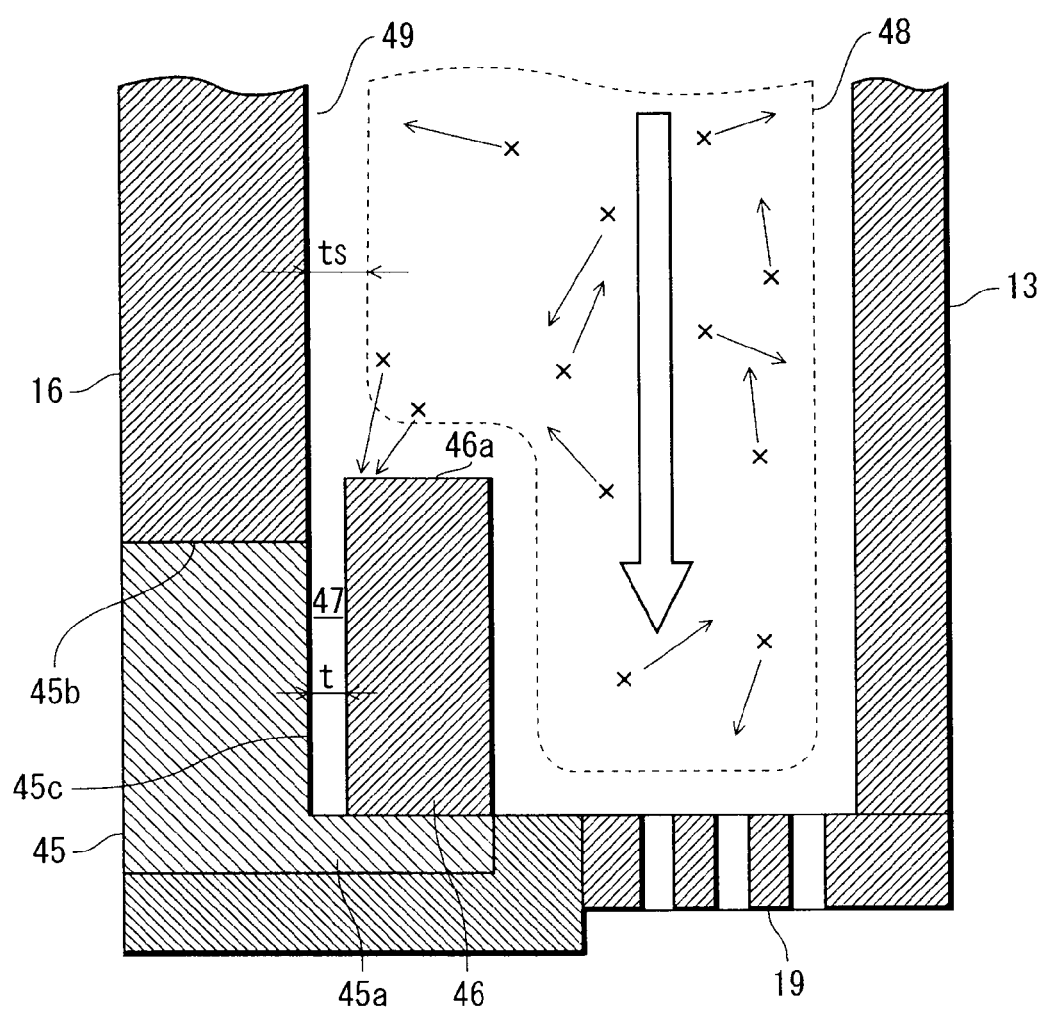
FIG. 3 is a schematic view used to explain the relationship between the thickness of a sheath and a gap between a ground electrode surface and a shielding member.

Incidentally, in the plasma processing apparatus 10, if a gap "t" between the ground electrode surface 45c of the grounding ring 45 and the shielding member 46 forming the groove-shaped space 47 is set to a value less than the thickness "ts" of a sheath 49 present between the side covering member 16 and the plasma 48, as shown in FIG. 3, then the opening of the groove-shaped space 47 cannot be faced with the plasma 48. As a result, electrons in the plasma 48 (shown by "X" in the figure) can hardly enter the groove-shaped space 47 and do not reach the ground electrode surface 45c. Thus, a DC current does not flow through the processing space PS and the exhaust flow passage 18.

Hence, in the present embodiment, the gap "t" between the ground electrode surface 45c and the shielding member 46 is set to a value greater than the thickness "ts" of the sheath 49. Consequently, the opening of the groove-shaped space 47 can be faced with the plasma 48. Note that since, in general, the thickness of a sheath is approximately 0.5 mm, the gap "t" is set to a value greater than 0.5 mm.

In addition, from the viewpoint of preventing the breakage of the shielding member 46 and facilitating the handling thereof, the thickness of the shielding member 46 in the radial direction thereof is set to, for example, 5 mm or greater at which the rigidity of the shielding member 46 can be ensured.

According to the plasma processing apparatus 10 in accordance with the present invention, the shielding member 46 is disposed in the exhaust flow passage 18, so as to locate along the surfaces of the side covering member 16 and the like and along the flow of exhaust gas, interpose between the flow of exhaust gas and the grounding ring 45, and form the cross-sectionally long groove-shaped space 47 between the shielding member 46 and the grounding ring 45. Consequently, it is possible to keep electrons reachable to the ground electrode surface 45c over a prolonged period of time. Thus, it is possible, over a prolonged period of time, to control a decrease in the value of a DC current flowing through the processing space PS and the exhaust flow passage 18.

In addition, in the plasma processing apparatus 10, the edge 46a of the shielding member 46 protrudes toward the upstream of the flow of exhaust gas more than the edge 45b of the grounding ring 45 on the opening side thereof. Consequently, it is possible to cause radicals trying to enter from the opening into the groove-shaped space 47 to actively adhere to the shielding member 46 near the opening of the groove-shaped space 47. As a result, it is possible, over a prolonged period of time, to prevent the ground electrode surface 45c from being covered with a deposition film.

Furthermore, in the plasma processing apparatus 10, since the gap "t" between the ground electrode surface 45c and the shielding member 46 is set to a value greater than 0.5 mm, the opening of the groove-shaped space 47 can be faced with the plasma 48. Thus, it is possible to let electrons move from the plasma 48 to the ground electrode surface 45c through the opening, thereby enabling a DC current to reliably flow through the processing space PS and the exhaust flow passage 18.

Although the shielding member 46 is mounted on the lower extension part 45a of the grounding ring 45, an engagement part for engaging with the periphery of the grounding ring 45 may be provided in the shielding member 46 to engage the grounding ring 45 and the shielding member 46 with each other.

Although the grounding ring 45 and the shielding member 46 are provided near the exhaust plate 19 of the exhaust flow passage 18, the grounding ring 45 and the shielding member 46 may be provided anywhere in the processing space PS or in the exhaust flow passage 18, as long as they are close to the plasma. However, the shielding member for forming the cross-sectionally long groove-shaped space in conjunction with the grounding ring must be located along the flow of exhaust gas or along the surfaces of component parts.

In addition, although the grounding ring 45 is formed of silicon, the grounding ring may be formed of silicon carbide. Likewise, the shielding member 46 may be formed not only of quartz but also of a metal material onto the surface of which an insulating film has been flame-sprayed.

Furthermore, the ground electrode is not limited to an annular member such as the grounding ring 45. Alternatively, the ground electrode may be formed of a plurality of conductive members disposed around the susceptor 12.

Although in the above-described plasma processing apparatus 10, two types of high-frequency power are supplied to the conductor part 15 of the susceptor 12, one type of high-frequency power may be supplied to the conductor part 15 of the susceptor 12 and the upper electrode plate 39 of the shower head 36, respectively. Also in this case, the same advantageous effect as described above can be obtained.

Next, examples of the present invention will be described.

First, the present inventor confirmed how the presence/absence of the shielding member 46 in the plasma processing apparatus 10 affected the rate of decrease (degradation rate) in the value of a DC current flowing within the processing space PS.

Example 1

In the plasma processing apparatus 10, a gap "t" between the ground electrode surface 45c of a grounding ring 45 and a shielding member 46 was set to 2.5 mm, and the amount of protrusion "T" of the edge 46a of the shielding member 46 on the opening side thereof from the edge 45b of the grounding ring 45 on the opening side thereof (see FIG. 2—hereinafter simply referred to as the "protruding amount "T" of the shielding member 46") was set to 0 mm.

After that, an etching treatment on a wafer W was repeated in the plasma processing apparatus 10. In each case of etching treatment, a DC current flowing through a processing space PS was measured and the measured values of the DC current were shown by "X" in the graph of FIG. 4. Then, a calculation was made of an approximate expression of the rate of decrease in the value of the DC current (hereinafter simply referred to as the "decrease rate") for Example 1 in the graph of FIG. 4, thus obtaining Equation (1) shown below:

$$DC \text{ current value} = -1.75 \times 10^{-5} \times \text{number of treated wafers} + 1.33 \quad (1)$$

where, the term "$-1.75 \times 10^{-5}$", corresponds to the decrease rate.

Example 2

In a plasma processing apparatus 10, a gap "t" was set to 3.5 mm and the protruding amount "T" of a shielding member 46 was set to 3.0 mm.

After that, an etching treatment on a wafer W was repeated in the plasma processing apparatus 10, as in Example 1. In each case of etching treatment, a DC current flowing through a processing space PS was measured and the measured values of the DC current were shown by "Δ" in the graph of FIG. 4. Then, a calculation was made of an approximate decrease rate expression for Example 2, thus obtaining Equation (2) shown below $$DC \text{ current value} = -6.04 \times 10^{-6} \times \text{number of treated wafers} + 1.39 \quad (2)$$

where, the term "$-6.04 \times 10^{-6}$" corresponds to the decrease rate (degradation rate).

Comparative Example 1

In the plasma processing apparatus 10, the shielding member 46 was removed. Then, an etching treatment on a wafer W was repeated in the plasma processing apparatus 10, as in Example 1. In each case of etching treatment, a DC current flowing through a processing space PS was measured and the measured values of the DC current were shown by "O" in the graph of FIG. 4. Then, a calculation was made of an approximate decrease rate expression for Comparative Example 1 in the graph of FIG. 4, thus obtaining Equation (3) shown below:

$$DC \text{ current value} = -1.21 \times 10^{-4} \times \text{number of treated wafers} + 1.44 \quad (3)$$

where, the term "$-1.21 \times 10^{-4}$" corresponds to the decrease rate (degradation rate).

Figure 4:
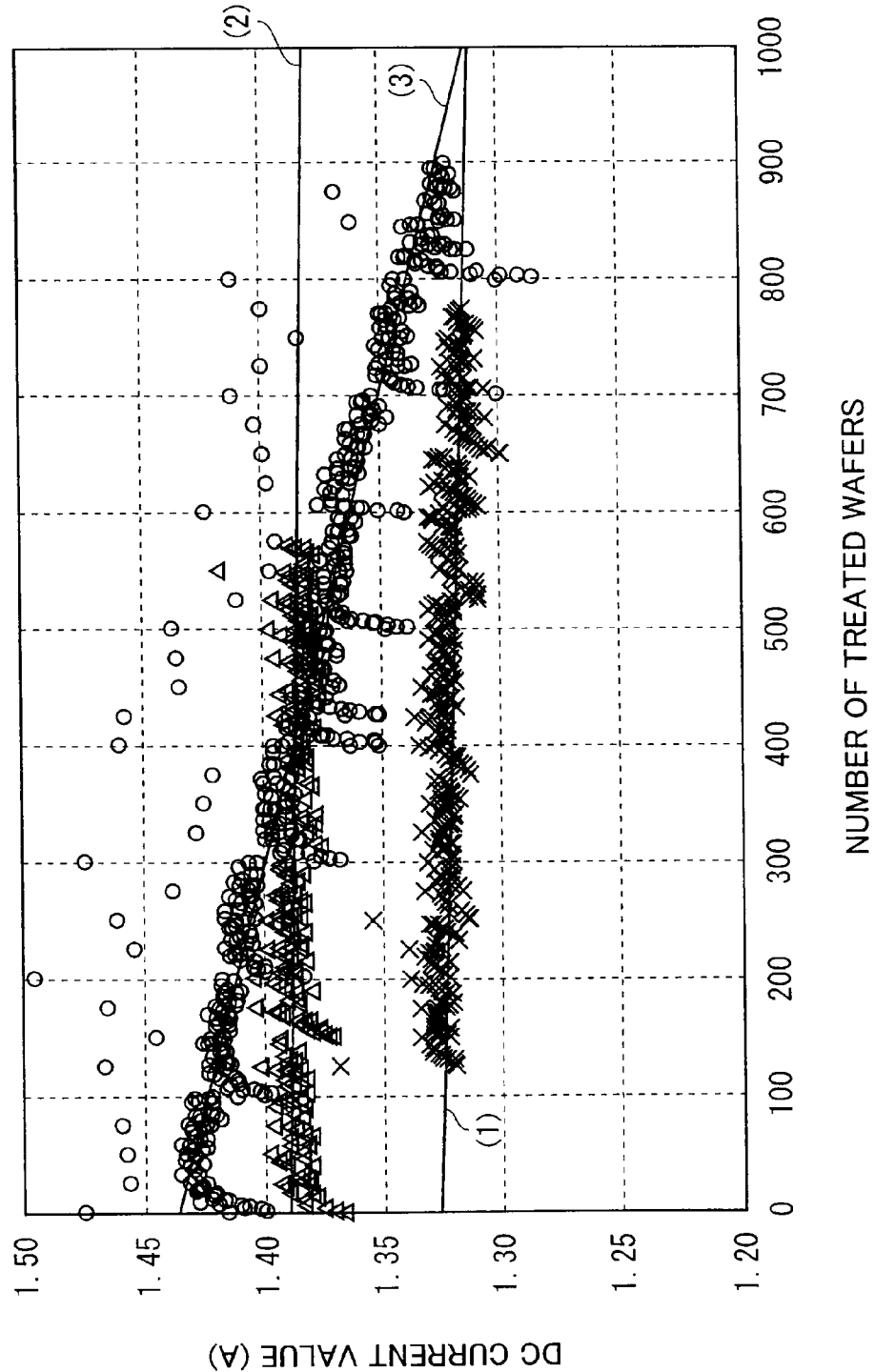
FIG. 4 is a graph showing how the presence/absence of a shielding member affects the rate of decrease in the value of a DC current flowing within a processing space.

A comparison made among decreases in a DC current in Examples 1 and 2 and Comparative Example 1 in the graph of FIG. 4 proved that the decrease rate of Example 1 was improved to approximately 1/7 the decrease rate of Comparative Example 1 and the decrease rate of Example 2 was improved to approximately 1/20 the decrease rate of Comparative Example 1.

Next, the present inventor confirmed how the gap "t" affected the decrease rate of a DC current.

Example 3

In a plasma processing apparatus 10, a gap "t" was set to 4.0 mm and the protruding amount "T" of a shielding member 46 was set to 3.0 mm.

After that, an etching treatment on a wafer W was repeated in the plasma processing apparatus 10, as in Example 1. In each case of etching treatment, a DC current flowing through a processing space PS was measured and the measured values of the DC current were shown by "□" in the graph of FIG. 5.

Example 4

In a plasma processing apparatus 10, a gap "t" was set to 5.0 mm and the protruding amount "T" of a shielding member 46 was set to 3.0 mm.

After that, an etching treatment on a wafer W was repeated in the plasma processing apparatus 10, as in Example 1. In each case of etching treatment, a DC current flowing through a processing space PS was measured and the measured values of the DC current were shown by "X" in the graph of FIG. 5.

Figure 5:
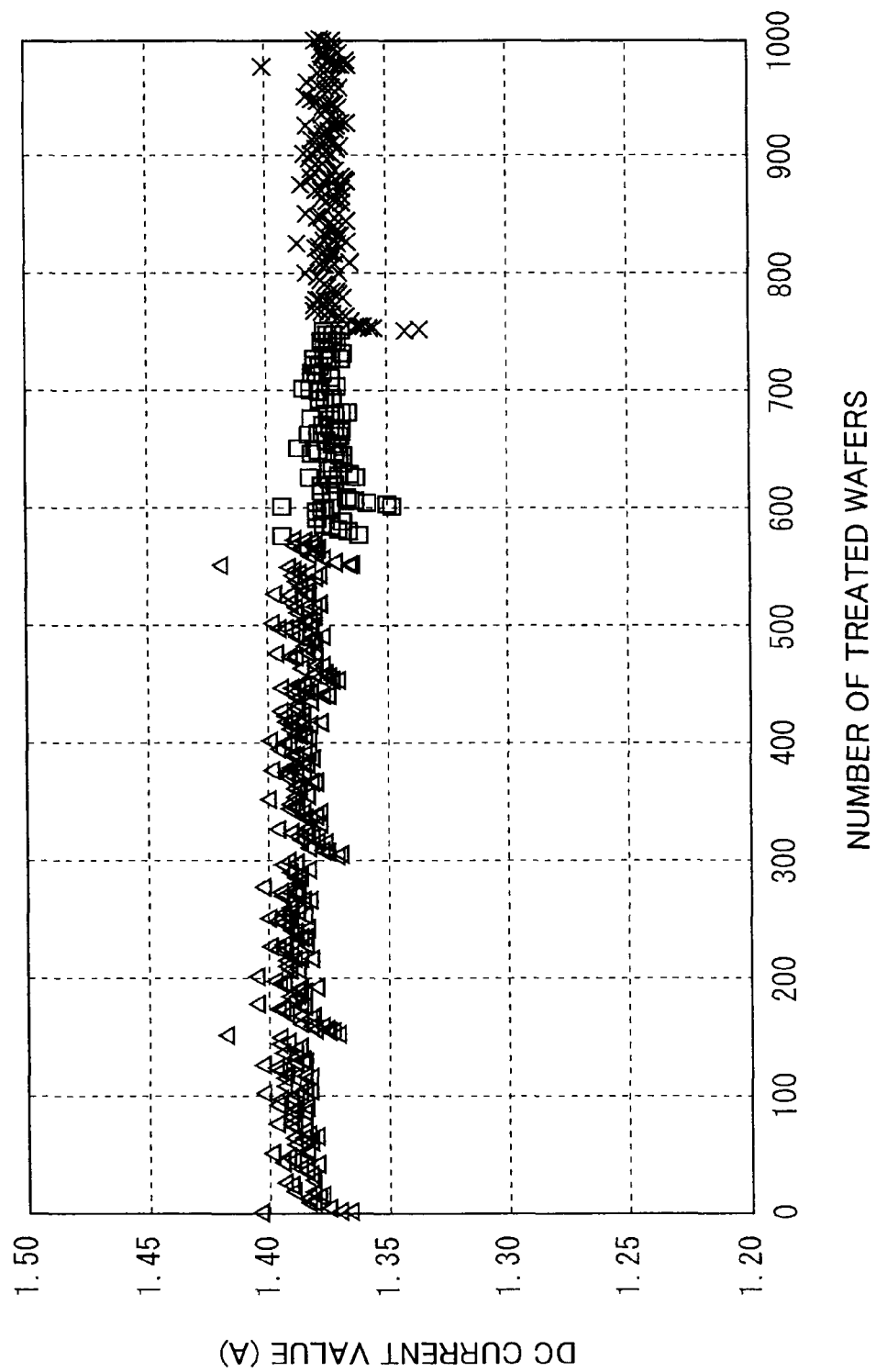
FIG. 5 is a graph showing how a gap between a ground electrode surface and a shielding member affects the rate of decrease in the value of a DC current flowing within a processing space.

The measured values of a DC current in Example 2 (where the gap "t" was 3.5 mm) were also shown by "A" in the graph of FIG. 5.

A comparison made among DC current values in Examples 2, 3 and 4 in the graph of FIG. 5 proved that the DC current values hardly changed at all in either example and that the decrease rate of a DC current was almost 0 in either example.

As described above, it proved from Examples 1 to 4 that a decrease in the value of a DC current flowing through the processing space PS could be controlled over a prolonged period of time as long as the gap "t" was not less than 2.5 mm but not greater than 5.0 mm. The reason for this was assumed to be that electrons were not blocked from entering the groove-shaped space 47, whereas radicals were prevented from entering thereinto, by setting the gap "t" to a value from 2.5 mm to 5.0 mm.

It becomes easier for radicals to enter the groove-shaped space 47 as the gap "t" becomes greater. Thus, there arises the possibility that a deposition film is formed on the ground electrode surface 45c and the value of a DC current flowing through the processing space PS is decreased. Since the DC current hardly changed at all, as shown in Example 4, even if the gap "t" was 5.0 mm, it has proven that radicals adhere to both wall surfaces near the opening of the groove-shaped space 47 before entering deep into the groove-shaped space 47 and reach the ground electrode surface 45c, if the gap "t" is at least 5.0 mm. Note here that since a length L (see FIG. 2) along the flow of exhaust gas in the shielding member 46 is 15 mm, an aspect ratio in a cross section of the groove-shaped space 47 is 3.0. Consequently, radicals do not enter deep into the groove-shaped space 47 if the aspect ratio in the cross section of the groove-shaped space 47 is 3.0 or greater. Thus, it has proven that it is possible, over a prolonged period of time, to prevent the entire surface of the ground electrode surface 45c from being covered with a deposition film.

Incidentally, if the gap "t" becomes less or an aspect ratio in a cross section of the groove-shaped space 47 becomes greater (i.e., the protruding amount "T" of the shielding member 46 becomes greater), it becomes difficult for not only radicals but also electrons to enter the groove-shaped space 47. If electrons can hardly enter the groove-shaped space 47, then a DC current can hardly flow through the processing space PS. Hence, the present inventor examined how the gap "t" and the protruding amount "T" affected the easiness to flow of a DC current.

Specifically, since plasma in the processing space PS fluctuated if a DC current could hardly flow in the processing space PS, the present inventor observed plasma fluctuations while changing the values of the gap "t" and the protruding amount "T" to various values.

Examples 5 to 13

First, plasma fluctuations were observed in a plasma processing apparatus 10 provided with a new grounding ring 45, while changing the values of the gap "t" and the protruding amount "T" to various values during etching treatment. The results of observation were summarized in a table shown in FIG. 6.

Figure 6:
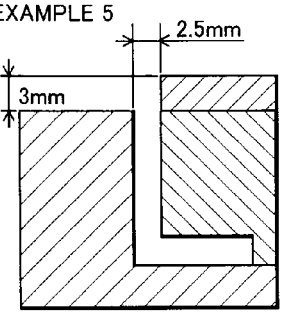
FIG. 6 is a table summarizing the result of observing plasma fluctuations in a plasma processing apparatus provided with a new grounding ring, while changing a gap between a ground electrode surface and a shielding member and the protruding amount of the edge of the shielding member to various values.

From the table of FIG. 6, it proved that the greater the gap "t" became, the less plasma fluctuations were likely to occur and that plasma fluctuations hardly occurred if the gap "t" was 3.5 mm. The reason for this was assumed to be that the opening of a space formed by the grounding ring 45 and the shielding member 46 widened and electrons could smoothly enter the space.

It also proved that if the space formed by the grounding ring 45 and the shielding member 46 was cross-sectionally L-shaped, plasma fluctuations were more likely to occur, whereas plasma fluctuations did not occur if the space was at least groove-shaped.

As described heretofore, it has proven that if the grounding ring 45 and the shielding member 46 form a groove-shaped space and the gap "t" between the grounding ring 45 and the shielding member 46 is not less than 3.5 mm, it is possible to prevent the occurrence of plasma fluctuations.

Examples 14 to 20

Next, after performing an etching treatment on a wafer W for 50 hours in a plasma processing apparatus 10, the present inventor observed plasma fluctuations, while changing the values of a gap "t" and a protruding amount "T" to various values during the etching treatment. Then, the present inventor summarized the observation results in a table shown in FIG. 7.

Figure 7:
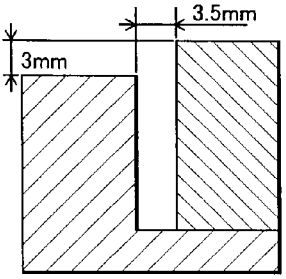
FIG. 7 is a table summarizing the result of observing plasma fluctuations in a plasma processing apparatus wherein an etching treatment has been performed for 50 hours, while changing a gap between a ground electrode surface and a shielding member and the protruding amount of the edge of the shielding member to various values.

From the table of FIG. 7, it proved that the greater the protruding amount "T" became, the more plasma fluctuations were likely to occur. The reason for this was assumed to be that if the protruding amount "T" was too large, the edge 46a of a shielding member 46 blocked electrons from entering a groove-shaped space 47. In particular, plasma fluctuations occurred if the protruding amount "T" was 6.5 mm in a case where the gap "t" was 4.0 mm, whereas plasma fluctuations did not occur if the protruding amount "T" was 3 mm. Hence, it proved that the protruding amount "T" was preferably 3 mm or smaller.

As described heretofore, it has proven that it is possible to prevent the occurrence of plasma fluctuations if the protruding amount "T" is not greater than 3 mm.

Note that it has also been confirmed in the table of FIG. 7, as in the table of FIG. 6, that the greater the gap "t" becomes, the less plasma fluctuations are likely to occur.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2007-089804 filed Mar. 29, 2007, which is hereby incorporated by reference herein in its entirety.

What is claimed is:

1. A plasma processing apparatus comprising:
    an accommodating compartment that has a processing space therein, accommodates a substrate and performs a plasma treatment on the substrate;
    a first electrode that mounts the substrate thereon and supplies high-frequency power to the processing space;
    a second electrode that is disposed such as to face the first electrode and applies a DC voltage to the processing space;
    an exhaust flow passage that is formed between side walls of the accommodating compartment and first electrode and exhausts gas from the processing space to the outside of the accommodating compartment; and
    a ground electrode that is disposed in the exhaust flow passage and functions as a ground for the DC voltage applied from the second electrode, wherein
    the ground electrode is disposed such as to cover a lower portion of the first electrode, a shielding member is provided such as to surround the ground electrode,
    the ground electrode and the shielding member form therebetween a groove-shaped space, and
    the groove-shaped space is open toward the upstream of a flow of the gas.

2. A plasma processing apparatus as claimed in claim 1, wherein a gap between the ground electrode and the shielding member forming the groove-shaped space is greater than 0.5 mm.

3. A plasma processing apparatus as claimed in claim 2, wherein the gap is not less than 2.5 mm but not greater than 5.0 nun.

4. A plasma processing apparatus as claimed in claim 1, wherein the first electrode includes therein a conductor part to which the high frequency power is supplied, and a covering member made of an insulating material is disposed such as to cover the conductor part.

5. A plasma processing apparatus as claimed in claim 1, wherein an aspect ratio in a cross section of the groove-shaped space is not less than 3.0.

6. A plasma processing apparatus as claimed in claim 1, wherein the edge of the shielding member on the opening side of the groove-shaped space protrudes along the flow of the gas from the edge of the ground electrode on the opening side.

7. A plasma processing apparatus as claimed in claim 6, wherein the amount of protrusion of the edge of the shielding member on the opening side from the edge of the ground electrode on the opening side is not greater than 3 mm.

8. A plasma processing apparatus as claimed in claim 1, further comprising an exhaust plate that is disposed in the exhaust flow passage and is a plate-like member having a multitude of vent holes.

9. A plasma processing apparatus as claimed in claim 1, wherein the ground electrode is formed of silicon or silicon carbide.

10. A plasma processing apparatus as claimed in claim 1, wherein the shielding member is formed of quartz or a metal material onto the surface of which an insulating film has been flame-sprayed.

11. A plasma processing apparatus as claimed in claim 1, wherein the shielding member is disposed concentrically with the ground electrode.

12. A plasma processing apparatus comprising:
    an accommodating compartment that has a processing space therein, accommodates a substrate and performs a plasma treatment on the substrate;
    a first electrode that mounts the substrate thereon and supplies high-frequency power to the processing space;
    a second electrode that is disposed such as to face the first electrode and applies a DC voltage to the processing space;
    an exhaust flow passage that is formed between side walls of the accommodating compartment and first electrode and exhausts gas from the processing space to the outside of the accommodating compartment; and
    a ground electrode that is disposed in the exhaust flow passage and functions as a ground for the DC voltage applied from the second electrode, wherein
    the ground electrode is disposed such as to cover a lower portion of the first electrode,
    a shielding member is provided such as to surround the ground electrode,
    the ground electrode and the shielding member form therebetween a groove-shaped space,
    the groove-shaped space is open toward the upstream of a flow of the gas,
    the ground electrode has a L-shaped cross section and a ring-shaped body; and
    a gap between the ground electrode and the shielding member forming the groove-shaped space is greater than 0.5 mm.

13. A plasma processing apparatus as claimed in claim 12, wherein the ground electrode is formed of silicon or silicon carbide.

14. A plasma processing apparatus as claimed in claim 12, wherein the gap is not less than 2.5 mm but not greater than 5.0 mm.

15. A plasma processing apparatus as claimed in claim 12, wherein the shielding member is formed of quartz or a metal material onto the surface of which an insulating film has been flame-sprayed.

16. A plasma processing apparatus as claimed in claim 12, wherein an aspect ratio in a cross section of the groove-shaped space is not less than 3.0.

17. A plasma processing apparatus as claimed in claim 12, wherein the edge of the shielding member on the opening side of the groove-shaped space protrudes along the flow of the gas from the edge of the ground electrode on the opening side.

18. A plasma processing apparatus as claimed in claim 17, wherein the amount of protrusion of the edge of the shielding member on the opening side from the edge of the ground electrode on the opening side is not greater than 3 mm.

19. A plasma processing apparatus as claimed in claim 12, wherein the first electrode includes therein a conductor part to which the high frequency power is supplied, and a covering member made of an insulating material is disposed such as to cover the conductor part.

20. A plasma processing apparatus as claimed in claim 12, wherein the shielding member is disposed concentrically with the ground electrode.

* * * * *